July 24, 1951 T. L. WALTERS 2,561,434

ELECTRONIC TELEGRAPH REPEATER

Filed Jan. 15, 1948 2 Sheets-Sheet 1

Inventor
TREVOR LYNDON WALTERS
By [signature]
Attorney

Inventor
TREVOR LYNDON WALTERS
By R.P. Morris
Attorney

Patented July 24, 1951 2,561,434

UNITED STATES PATENT OFFICE 2,561,434

ELECTRONIC TELEGRAPH REPEATER

Trevor Lyndon Walters, Kenton, Harrow, England, assignor to International Standard Electric Corporation, New York, N. Y., a corporation of Delaware Application January 15, 1948, Serial No. 2,354
In Great Britain January 16, 1947

8 Claims. (Cl. 178—70)

Figure 1:
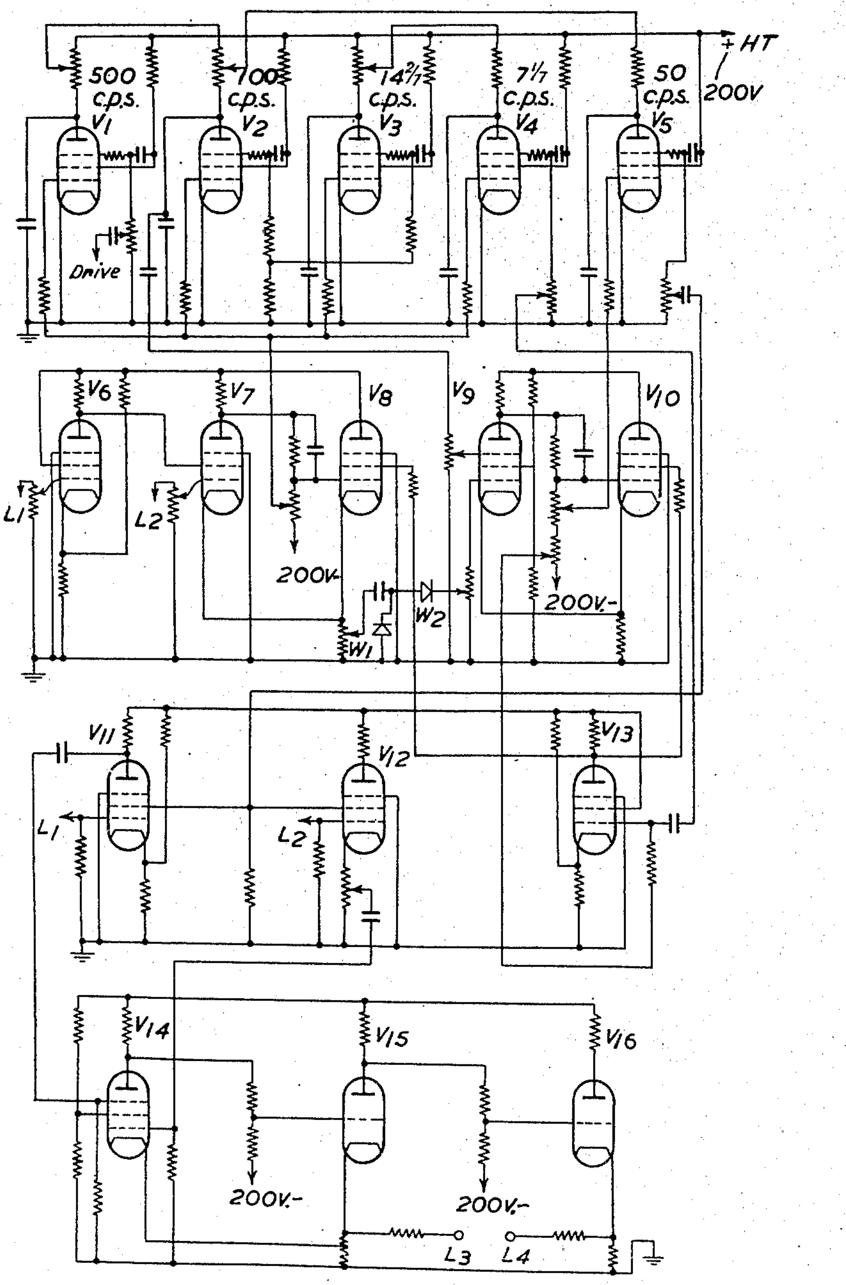

This invention relates to electronic repeaters for teleprinter signals.

The object of the invention is to provide an arrangement that will receive badly distorted signals and automatically transmit corresponding signals re-shaped into nearly perfect form.

Regenerative repeaters for this purpose have previously been proposed in which an oscillator for timing the reception and retransmission of each signal element has been started into oscillation on receipt of the start element of a signal. It is, however, difficult to ensure that such an oscillator shall be started up without appreciable delay and if such delay occurs, the timing of the separate elements of the signal and the consequent perfect re-shaping of those elements cannot be properly carried out.

Oscillators that maintain their frequency with high precision cannot be relied upon to start up suddenly, and conversely oscillators that can be relied upon to start up when required, do not maintain a high precision of frequency.

According to one feature of the present invention, a regenerative repeater for teleprinter signals, comprises an oscillator for timing the reception and retransmission of each signal element and means jointly under the control of the start element of a signal and of a free running oscillator having a frequency that is a multiple of the frequency of the first-mentioned oscillator for starting said first-mentioned oscillator into oscillation and controlling its frequency.

The free-running oscillator thus controls the frequency of the timing oscillator and preferably it does so by means of at least two stages of frequency subdivision. Preferably also an oscillator for timing the whole period of the signal is also controlled from the free-running oscillator by means of at least two stages of frequency subdivision.

In the embodiment to be described for a so-called 7½ unit code, i. e. a code having a start element and five code elements all of unit length and a stop element of 1½ units length, the period of the oscillator timing the signal is made equal to 7 unit lengths, for a reason that will be explained hereinafter. For the usual signalling speed of 50 bands, the oscillator timing the signal elements has a frequency of 50 c. p. s. and this is controlled from a free-running oscillator of a frequency of 2,500 c. p. s. through intermediate oscillators of 500 and 100 c. p. s. respectively. Similarly the oscillator of 7 unit period, i. e. of $7^1/_7$ c. p. s. is controlled from an oscillator of $14^2/_7$ c. p. s. which in turn is controlled by the oscillator of 100 c. p. s.

According to another feature of the present invention a regenerative repeater for teleprinter signals comprises electronic oscillator means, wholly electronic means for starting up the said oscillator means, means controlled from said oscillator means for timing the signal and separate elements of the signal, and wholly electronic means for regenerating the signals under control of said timing means and for repeating the regenerated signals. In this way delays and imperfections due to the use of contact-making relays are avoided.

Figure 2:
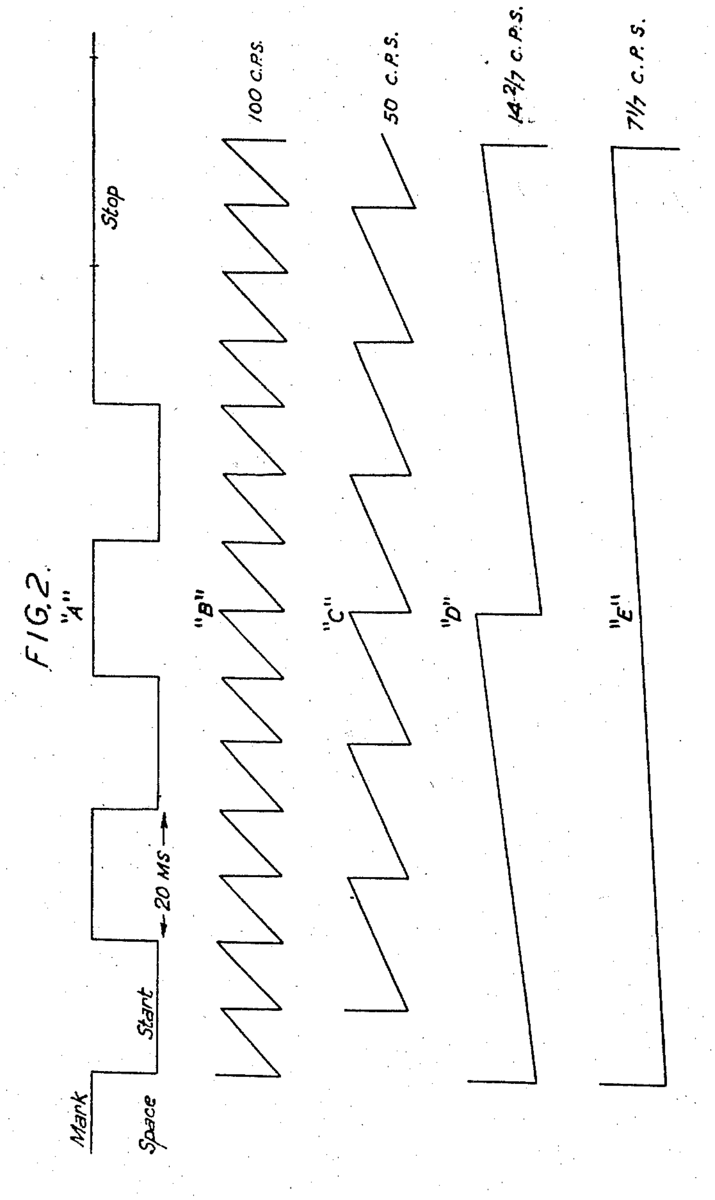

An embodiment of the invention will now be described with reference to the accompanying drawings, in which Fig. 1 shows the circuits of a regenerative repeater for a start-stop 5-unit code, and Fig. 2 shows the relative phases of the anode voltages of certain time base oscillators of Fig. 1 to the incoming signal.

Referring to Fig. 1, thermionic valves (pentodes) $V_1$, $V_2$, $V_3$, $V_4$ and $V_5$ constitute saw-tooth oscillators of a known kind, the circuit constants being so dimensioned that the respective natural frequencies are 500, 100, 14²⁄₇, 7¹⁄₇, and 50 c. p. s. The oscillator $V_1$ is driven from a free-running oscillator (not shown) of 2500 c. p. s. which is controlled to the required degree of accuracy of frequency, the drive being by means of a connection at the point D in known manner. In the condition when no signals are being received the grids of the valves V1 . . . V5 are biassed to cut-off, and the anode condensers are therefore in charged condition, being connected between positive of the H. T. supply and earth. During operation oscillator $V_1$ controls oscillator $V_2$ and oscillator $V_2$ controls oscillators $V_3$ and $V_5$, whilst oscillator $V_3$ controls oscillator $V_4$.

The input signals are applied to the grids of valves V6 and V7 and also to the grids of valves V11 and V12 over the lines L—1 and L—2. A valve V8 is coupled to valve V7 to form a trigger circuit. Other pairs of valves V9, V10 and V14, V15 also form respective trigger circuits. When no signals are being received, or when a continuous marking condition is applied to the line L1, L2, the left-hand valve of each pair constituting a trigger circuit is conducting whilst the right-hand valve is biassed to cut-off. A small negative potential applied to the grids of the left-hand valves V7, V9 or V14 will render them non-conducting and cause the right-hand valves V8, V10 and V15 respectively to become conducting. The action is such that subsequent reversals of the signal potentials applied to the grids of the left-hand valves will not reverse the trigger action, the trigger pairs being reset in a manner described below.

The operation of the circuit is as follows:

Whilst a marking signal is being received, positive potential is applied over wire L2 to the grid of valve V7 and negative potential is applied over wire L1 to the grid of valve V6, such potentials emanating from the distant transmitter (not shown) whose signals are to be regenerated and repeated. When the start element of a signal is received these potentials are reversed as is well known in the polar system of transmission, and valve V7 is rendered non-conducting, and V6 becomes conducting. The anode potential of V6 drops, thus reducing the screen grid potential of V7. This assists in keeping valve V7 non-conducting. The other valve V8 of the trigger pair V7 and V8 becomes conducting and the rise in potential of the control grid of valve V8 is applied to the control grids of valves V1 . . . V4 and they commence to operate, generating saw tooth wave forms. If the free-running oscillator controlling the operation of V1 is, as assumed above, of a frequency of 2500 c. p. s. then the maximum difference between the reversal of the trigger pair V7 and V8 and the starting of V1 (and of V2 controlled thereby) is 0.4 milliseconds. As each of the valves V1 . . . V4 starts to operate the corresponding condenser discharges thus producing a sudden fall of potential of the anode of the corresponding valve. When V2 starts its operation, therefore, a negative pulse will be transmitted from the anode of V2 to the suppressor grid of valve V9, tending to render that valve non-conducting, but a simultaneous positive pulse from the cathode of V8 through the rectifier W2 to the control grid of valve V9 nullifies this effect.

The wave forms at the anode of V2 is shown in line B of Fig. 2. On the occurrence of the second negative pulse from the anode, which is also applied to the suppressor grid of valve V9, this last mentioned valve is rendered non-conducting, as the cathode current of valve V8 is now steady and there is no pulse on the control grid of valve V9 to nullify the effect of the negative pulse derived from the anode of V2 and applied to the suppressor grid of valve V9, as outlined in the previous paragraph hereof. When the valve V9 becomes non-conducting the other valve of the trigger pair becomes conducting and the change of potential on the anode of V9 and control grid V10 is applied to the control grid of V5, which starts into operation locked to the operation of valve V2. The wave form at the anode of V5, which operates at 50 c. p. s. is shown in line C of Fig. 2, and it will be seen that it provides a sudden fall of potential at an interval of 10 ms. after the commencement of the start element and at intervals of 20 ms. thereafter, i. e. at the centre of each subsequent signal element period. Positive pulses at these intervals therefore occur at the screen grid of valve V5 and these positive pulses are applied to the screen grids of valves V11 and V12, thus momentarily rendering both these valves conducting. The bias normally applied to the control grids of these valves, in the absence of any incoming signals would make both valves non conducting. If however the incoming signal applies positive potential over L1, then at the instant V11 becomes conducting because of the pulse from the valve V5, a negative pulse from the anode of valve V11 is applied to the suppressor grid of valve V14 and this valve becomes non-conducting, valve V15 becomes conducting. If on the other hand the incoming signal is applying positive potential over L2 then, V12 becomes momentarily conducting on the application of the pulse from valve V5, and a positive pulse from the cathode of valve V12 is applied to the control grid of valve 14 and valve V14 remains conducting. In this manner the trigger circuit V14, V15 is made to follow the sign of the input signal. If the valve V15 is conducting, valve V16 is non-conducting and vice versa. The terminals of the outgoing line are L3 and L4 and the signals sent over this line will be a replica of those received over line L1 L2 but delayed by 10 ms.

At the end of a signal interval the circuit must be reset to be ready to receive another signal. The re-setting is performed by means of the tube V4. The circuit of this tube has a period of 140 ms., as shown in line E of Fig. 2. At the end of this period the anode becomes suddenly negative and the suppressor grid positive. The positive pulse from the suppressor grid of V4 is applied to the control grid of V13, normally biased to cut off. Valve V13 becomes conducting and the anode thereof drops in potential, and since the anode potential is applied to the screen grids of valves V8 and V10 these valves of the respective trigger pairs viz. V7 and V9 being restored to their original conducting conditions. The grid potential of valves V1 . . . V5 is reduced to a point at which they become non-conducting by the bias from the trigger pair V7, V8.

It should be noted that, although the anode of V4 becomes suddenly negative at the commencement of operations, i. e. the receipt of a start element of a signal, the consequent positive pulse from the suppressor grid does not at that time cause valve V13 to become conducting since its control grid is kept highly negative from the V9, V10 trigger circuit.

Rectifiers W1 and W2 arranged between the cathode circuit of valve V8 and the grid circuit of valve V9 prevent any negative signal being passed from the former to the latter which would oppose V9 being rendered conducting.

At the moment at which the circuit is reset, a stop element will have been transmitted for 10 ms., so that even if the next start element of the received signal commences immediately because it occurs early by the maximum possible period, i. e. ½ a signal element, the stop element will continue to be transmitted to line L3, L4 for a further 10 ms. so that a minimum of 20 ms. stop signal is always transmitted.

The anode condensers of the valve V1—V4 will commence to charge up when these valves are made non-conducting by the trigger pair V7, V8. If a start element be received, the initial large pulse of positive on the control grids due to the condenser between the anode of tube V7 and the grid of tube V9, will ensure the discharge of the anode condensers and the restarting of the saw tooth oscillations in phase. The condensers of the circuit of valve V5 will have the full period of 20 ms. in which to charge so that the pulse obtained by the discharge of this condenser in the middle of the start element received will be of full amplitude.

What is claimed is:

1. In an apparatus for regenerating signal currents in an equal-unit-code telegraph system of the polar transmission type, an input circuit adapted to receive distorted signal currents of either polarity in a code of equal-units at random combinations, two electrically associated sawtooth oscillator circuits a source of regularly recurring pulses, having a repetition rate of a multiple of said oscillator circuits, said source coupled to said oscillator circuits and adapted to cause the operation thereof, an output circuit, means electrically associated with said output circuit for fixing under operation by said random combinations the period of duration and the polarity of each of said units in said output circuit by the full period length of the first one of said oscillator circuits, means for fixing the period of the sum of the total said units of a single operation in said output circuit by the whole period length of the second of said oscillator circuits.

2. In an apparatus for regenerating currents representing signal characters in an equal-unit-code telegraph system of the polar transmission type over an outgoing line from signal currents received over an incoming line, comprising an input circuit to receive code signals of either polarity of equal units at random combinations, a first sawtooth oscillatory circuit having a period equal to a single unit length of said code to regenerate the period of the units of said signals, a second sawtooth oscillatory circuit having a period equal substantially to the length of the sum of all the units and fractions thereof, in the code employed to regenerate the period of a complete code-character operation, a source of regularly recurring pulses, having a repetition rate of a multiple of said oscillator circuits, said source coupled to said oscillator circuits and adapted to cause the operation thereof, and means electrically coupling said two oscillatory circuits to each other and to said input circuit, whereby said periods are coordinated.

3. In an apparatus for regenerating currents representing signal characters as claimed in claim 2, wherein said first oscillatory circuit is normally inoperative, said first circuit responsive after a given delay to the receipt of the first unit of said code combination by said input circuit, and operable after said delay to produce sawtooth waves having a period equal to that of a single unit length of said code.

4. In an apparatus for regenerating currents representing signal characters as claimed in claim 2, further comprising a third sawtooth oscillatory circuit having a period less than that of a single unit length of said code and responsive to the receipt of the first unit of said code combination by said input circuit, for delaying operation of said first sawtooth oscillatory circuit.

5. In an apparatus for regenerating currents representing signal characters as claimed in claim 2, wherein said input circuit comprises a plurality of thermionic valves, each having a cathode, an anode and a control electrode, the control electrodes of each of said valves connected to an incoming line, each of said valves, adapted to conduct upon the receipt of a positive incoming signal element.

6. In an apparatus for regenerating currents representing signal characters as claimed in claim 2, wherein said input circuit further comprises a pair of thermionic valves each having control electrodes, an anode and a cathode, corresponding of the control electrodes of said valves connected in opposite sense to the incoming line, means for applying an impulse to corresponding electrodes of each of said valves from said first oscillatory circuit for timing the reception of each signal element, said valves having sufficient bias thereon to prevent conduction except upon the simultaneous receipt of one of the impulses from said oscillatory circuit and of a positive incoming signal element, and means to apply oppositely poled impulses for retransmitting a signal of a sign corresponding to the received incoming signal elements, upon one of said valves becoming conducting.

7. In an apparatus for regenerating currents representing signal characters as claimed in claim 2, further comprising a third sawtooth oscillatory circuit, said first oscillatory circuit being normally inoperative, means for causing said first oscillatory circuit to operate after a given delay, said means comprising a control device having two input circuits, means for applying said code signal units and the output of said third oscillatory circuit to separate of the input circuits of said control device, said control device responsive to input application of said third oscillatory circuit output alone for causing said first oscillatory circuit to operate.

8. In an apparatus for regenerating currents representing signal characters as claimed in claim 7, wherein said received code signal units are differentiated before application to said input circuit and the output of said third oscillatory circuit, the output of said third oscillatory circuit having substantially twice the period of a unit of said code signal.

TREVOR LYNDON WALTERS.

REFERENCES CITED

The following references are of record in the file of this patent:

UNITED STATES PATENTS

| Number | Name | Date |
|---|---|---|
| 2,406,096 | Morrison | Aug. 20, 1946 |
| 2,474,490 | Pelle | June 28, 1949 |